US006746238B2

United States Patent
Chu et al.

(10) Patent No.: US 6,746,238 B2
(45) Date of Patent: Jun. 8, 2004

(54) COOLING SYSTEM FOR REDUCING PARTICLES POLLUTION

(75) Inventors: Eric Chu, Hsin-Chu (TW); Kevin Chiang, Hsin-Chu (TW); Ling-Hsin Tseng, Hsin-Pu Chen (TW); Ken Yew, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/120,413

(22) Filed: Apr. 12, 2002

(65) Prior Publication Data

US 2002/0110770 A1 Aug. 15, 2002

Related U.S. Application Data

(62) Division of application No. 09/776,745, filed on Feb. 5, 2001.

(51) Int. Cl.[7] .............................................. F27D 15/02
(52) U.S. Cl. .............................. 432/81; 432/4; 432/233
(58) Field of Search .............................. 432/4, 5, 6, 81, 432/242, 247, 233; 118/715, 724, 725; 392/416, 418; 209/309, 405

(56) References Cited

U.S. PATENT DOCUMENTS 5,097,890 A * 3/1992 Nakao ........................ 165/206
5,256,060 A * 10/1993 Philipossian et al. ........ 432/152
5,354,198 A * 10/1994 Yates ............................. 432/5
6,427,470 B1 * 8/2002 Chu et al. ..................... 62/331

* cited by examiner

Primary Examiner—Gregory Wilson
(74) Attorney, Agent, or Firm—Dickinson Wright PLLC

(57) ABSTRACT

The present invention relates to a cooling system of a furnace, and more particularly, to a multi-cycle cooling system, located by the furnace door. The multi-cycle cooling system comprises the first gas cooling cycle, the second gas cooling cycle, the first liquid cooling cycle, the second liquid cooling cycle, the heat sinks and the heat insulation slot. When inside the process tube proceeds the high temperature process like depositing process, the first gas cooling cycle and the second gas cooling cycle are opened and the second liquid cooling cycle is closed at the same time. The second gas cooling cycle and the second liquid cooling cycle are assembled in the first flange, which is located on the process tube and contacts with the door. The first liquid cooling cycle in the second flange, which is located on the process tube and contacts with the first range, is always opened. When inside the process tube not proceeds the high temperature process, the first gas cooling cycle and the second gas cooling cycle are closed and the second liquid cooling cycle is opened at the same time. The heat sinks and the heat insulation slot are on the door to increase the heat conduction efficiency of the door and to extend the lifetime of the elements on the door. The first liquid cooling cycle and the second cooling cycle are the independent cooling systems to each other. The first flange is located between the door and the second flange.

24 Claims, 9 Drawing Sheets

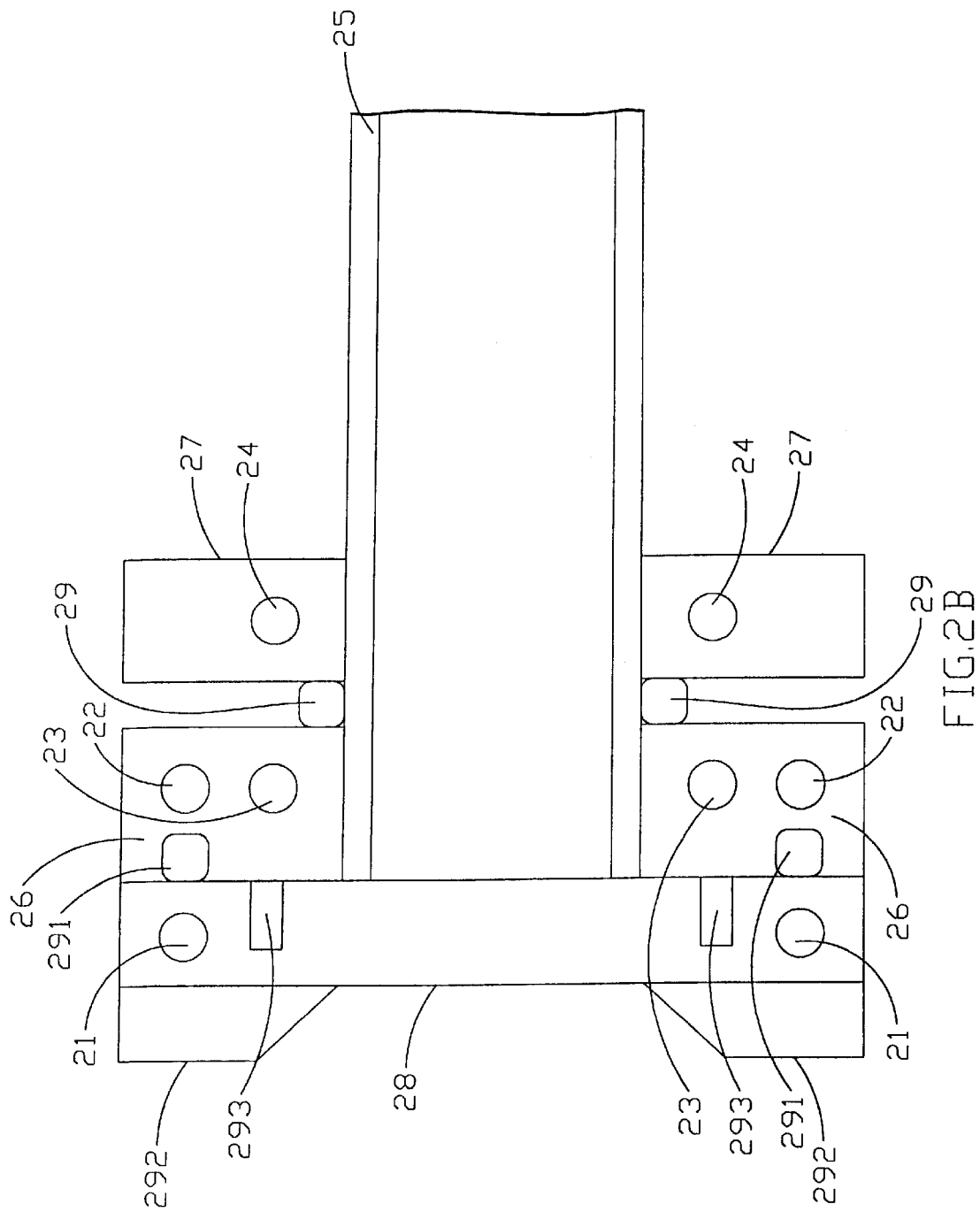

|  | Before high temperature process | In the high temperature process | After the high temperature |
|---|---|---|---|
| The first gas cooling cycle | Closing | Opening | Closing |
| The second gas cooling cycle | Closing | Opening | Closing |
| The first liquid cooling cycle | Opening | Closing | Opening |
| The second liquid cooling cycle | Opening | Opening | Opening |

FIG.2C

COOLING SYSTEM FOR REDUCING PARTICLES POLLUTION

This is a division of U.S. patent application Ser. No. 09/776,745, filed Feb. 5, 2001.

BACKGROUND OF THE INVENTION

1. Field of the Invention

The present invention relates to a cooling system of a furnace, more particularly, to a multi-cycle cooling system, located by the furnace door. We can decrease the probability of pollution by particles and extend the lifetime of the furnace devices by using different liquid and gas cycles, cooling the different steps of the semiconductor processes in the furnace.

2. Description of the Prior Art

Thermal processing furnaces are used to provide high temperature processing of semiconductor based wafers which are placed within a gas filled processing chamber. Several silicon, silicon based or other types of wafers are typically used in manufacturing semiconductor thermal processing. To avoid the contact of wafers with human hands, the wafers are mechanically inserted into the furnace. In vertical atmospheric diffusion furnaces the wafers are usually inserted into a tower which is on top of a pedestal assembly. The pedestal assembly vertically transports the tower into a tubular shaped chamber of the furnace where the thermal processing occurs. Using a similar principle principle horizontal processing furnaces utilize a cantilever assembly which supports wafers therein. The cantilever assembly is transported along a horizontal axis into a horizontally oriented tubular shaped processing chamber. In either type of furnace, it is desired that the wafers be protected from exposure to undesirable gases to ensure proper thermal processing. For example, oxygen., water vapor and particulates found in air can react with the wafers and adversely affect their chemical and physical properties.

In order to ensure the purity of the reactions the processing chamber of the furnace must be adequately sealed. Therefore, in a thermal processing furnace the interface between the pedestal assembly and processing chamber is designed to prevent reactant gases, from within the processing chamber, from leaking therethrough. Typically, in thermal diffusion furnaces the pedestal assembly is sealed from the tubular processing chamber by an O-ring. Moreover, the tubular processing chamber is usually mounted on a base and is also sealed thereto by an O-ring.

In the present semiconductor processes, the thermal process is generally used in many different kinds of processes like the deposition process, oxidation process, and other kinds of processes. We must heat wafers to a temperature before the thermal process. Therefore, the furnace will still be a tool to be used in the thermal process in the present semiconductor process.

The furnace is separated into two types: One is a horizontal type furnace, and the other is a vertical type furnace. The basic structures of these two types are the same. FIG. 1A shows a structure diagram of the horizontal type furnace. At first, we put the wafers 10 which need heat treatment on the wafer boat 1, which will be latter transported to the chamber by the paddle 12. The chamber is inside the process tube 12 of the furnace. After the wafer boat 11 arrives at the correct place in the chamber, the door of the furnace 14 must be closed to prevent outside gases and tiny particles from entering into the chamber, not to pollute the wafers 10. The closed door can also prevent the gases leaking out of the chamber from endangering workers when a chemical reaction, such as vapor deposition is taking place in the chamber. In order to make sure the temperature of the wafers are the same in the chamber, outside the process tube 13, there is a heater 18, which is used to adjust the temperature inside the chamber. This heater is often divided into several parts to adjust each temperature for different regions in the chamber, and also to increase the usability of the furnace.

FIG. 1B shows a cross section diagram of the furnace. The objective of the heat treatment in the furnace is to proceed with the semiconductor processes like vapor deposition or thermal oxidation. The reactant, is transported through the fluid tube to the chamber by the fluid injector. The pump 19 and the tube 195 extract the by-products that are produced in the reaction process and the remnant reactants after the reaction. The tube 195 connects the process tube 13 and the pump 19.

In order to make the contacting area between the door and the process tube airtight when the door 14 contacts the process tube 13, the furnace uses a flange 17 and an end O-ring 142 on the process tube 13 and near the door 14. The objective of the flange 17 is to create an airtight space after the door 14 closes on the process tube 13. The objective of the end O-ring 142 is to prevent the gas inside the process tube 13 from leaking out.

The flange 17 on the process tube 13 near the door 14 is used to make the process tube 13 connect hermetically with the door, and to make sure that the process tube is an airtight place. Therefore, the end O-ring 142 must be assembled in the flange 17 to prevent the gas escaping out of the chamber from affecting the process in the process tube 13. When the process temperature is higher, the materials of the end O-ring 142 lose their elasticity and will not have enough ability to seal up the crevice between the door 14 and the process tube 13. Therefore, the flange 17 on the process tube 13 near the door 14 includes a cooling system to protect the end O-ring 142. Especially in the high temperature processes inside the process tube 13, we need cooling systems having higher efficiencies to extend the lifetime of the end O-ring.

FIG. 1C shows part of a cross-section diagram of the furnace. Traditional flange 17 comprises the first flange 181, the second flange 182, the flange O-ring 183, the end O-ring 142, and the cooling system 184 which is located in the first flange 181 and the second flange 182. This cooling system is a single-cycle system. The cooling liquid flows into the second flange 182 and flows out of the first flange 181 after the cycle. Obviously, the liquid cooling cycle is used for cooling and to prevent the flange O-ring 183 and the end O-ring from losing their capabilities in the high temperature process. In the traditional flange cooling system, the cooling liquid is usually used in water. The boiling point of the water is about 100° C., therefore the temperature of the place near the flange will be limited in the cooling liquid which flows in the cooling system and the temperature of the place near the flange will not be raised at will. In other words, the temperature of the place near the flange is lower than other places on the process tube.

In the semiconductor process like the deposition process or the thermal oxidation process, the gas in the process tube usually proceed in the chemical reaction and produce some by-products in the reaction process. Following the property of the by-product being different, the critical temperature which divides by-products into the vapor phase and the solid phase is different. When the condition of the temperature is higher, the probability of the by-products coming to the vapor phase is higher. When the conditions of the temperature is lower, the by-products come to the solid phase easier. The solid phase by-products deposit easily on the place around inside the process tube to affect the qualities of the wafer in the process.

In general, we usually use the pump 19 that is on the back-end of the process tube 13 to extract the by-products, which are produced in the semiconductor process, from the process tube 13, but we can not extract the by-products from the process tube 13 absolutely. Sometimes, the remainder by-products in the process tube 13 are in the vapor phase, but sometimes the remainder by-products are usually in the solid phase depositing at the lower temperature place around inside the process tube. Furthermore, because we use pump 19 to extract the by-products from the process tube 13, the solid phase by-products may be brought to the pump 19 or the tube 195 which connects the pump 19 and the process tube 13 by running pump 19 to cause the process problems. Obviously, we can find that the vapor phase by-products are extracted by pump 19 continuously and not cause some serious problems. We can also find that the solid phase by-products not only deposit on the wafers but also deposit on the pump 19 and the tube 195 which connects process tube 13 and the pump 19. This situation makes wafers 10 which complete the process to be scraps and decreases the efficiency in extracting the by-products from the process tube 13 by the pump 19. Therefore, the solid phase by-products are the pollution sources which are not ignored in the furnace proceeding semiconductor process.

For example, when a low pressure chemical vapor deposition process is performed to form silicon nitride, $NH_4$ and $SiCl_2H_2$ (DCS) reciprocally interacts under 800° C. and 150 mill torrs environment. Herein, the ratio of $NH_4$ to $SiCl_2H_2$ is about 3:1 and attendant by-product is $NH_4Cl$. Further, because gas-like $NH_4Cl$ will become from vapor phase to solid phase white particles and deposit on the door 14 terminal in the process tube 13. Because the boiling point of the water is 100° C., and this temperature is lower than the temperature in $NH_4Cl$ becoming from vapor phase to solid phase white particles. The deposited particles will pollute the wafers 10 which are in the process tube 13 and the tubes which connect to the process tube 13 by the pump 19 extracting continuously. The pump 19 is on the end terminal of the process tube 13.

In the foregoing discussions about the furnace, we can find that when we use the furnace, we must use a cooling system in the flange to protect the end O-ring and the flange O-ring, therefore the solid phase particles deposit around the flange easily. The solid phase particles will pollute the wafers to become the scraps after proceeding the process or affect the proceeding of the pump, and even decrease the lifetime of the pump. Therefore, we must change the structure of the furnace to decrease the possibility of forming the solid phase particles. The present invention is directed to changing the cooling system of the flange.

SUMMARY OF THE INVENTION

In accordance with the above-mentioned invention backgrounds, the solid phase by-products take place a lot of problems in the furnace process in using traditional cooling system. The major objective of the invention is to decrease the probability in particle pollution in the furnace, especially to decrease the particle pollution which is came from the solid phase by-products in the process tube in the semiconductor process.

The second objective of this invention is to decrease the probability of the solid phase by-products depositing around the cooling system of flange to decrease the poor rate of the wafers after the thermal process.

The third objective of this invention is to provide a cooling system in the flange. This cooling system can be used in different ranges of the temperature to reach the cooling function and can decrease the probability of forming the particles.

The forth objective of this invention is to decrease the temperature of the end O-ring and the flange O-ring in the proceeding process effectively by using the cooling system in the flange to extend the lifetime of the end O-ring and the flange O-ring.

The fifth objective of this invention is to decrease the probability in forming solid phase by-products by using the multi-cycle cooling system in the flange to decrease the cost of the production.

It is a further objective of this invention to decrease the probability in forming solid phase by-products by using the multi-cycle cooling system in the flange to increase the cycle time in the process. This situation also can decrease the times for cleaning the furnace and increasing the efficiency in the preceding process.

In accordance to the foregoing objectives, the present invention provides a multi-cycle cooling system to make the temperature of the place around the end O-ring and the flange O-ring higher than the critical temperature which divides by-product into the vapor phase and the solid phase to decrease the probability in forming solid phase by-products. This situation makes the wafers which are proceeding process not to be polluted by solid phase by-products depositing on the surface of the wafers to increase the probability in producing scraps. This multi-cycle cooling system can protect the end O-ring and the flange O-ring not to be damaged from the high temperature to extend the lifetime of the end O-ring and the flange O-ring. This multi-cycle cooling system also can increase the cycle time of the proceeding process and decrease the times in cleaning the furnace. This multi-cycle cooling system further can increase the efficiency of the process and decrease the cost of the production.

BRIEF DESCRIPTION OF THE DRAWINGS

In the accompanying drawing forming a material part of this description, there is shown:

FIG. 2B shows a cross-section diagram which comprises the process tube, the flange, the door, and the cooling system to be composed in another form of the present invention;

FIG. 2C shows the basic operating theorems in the cooling system which is provided from the present invention.

DESCRIPTION OF THE PREFERRED EMBODIMENT

Figure 1A:
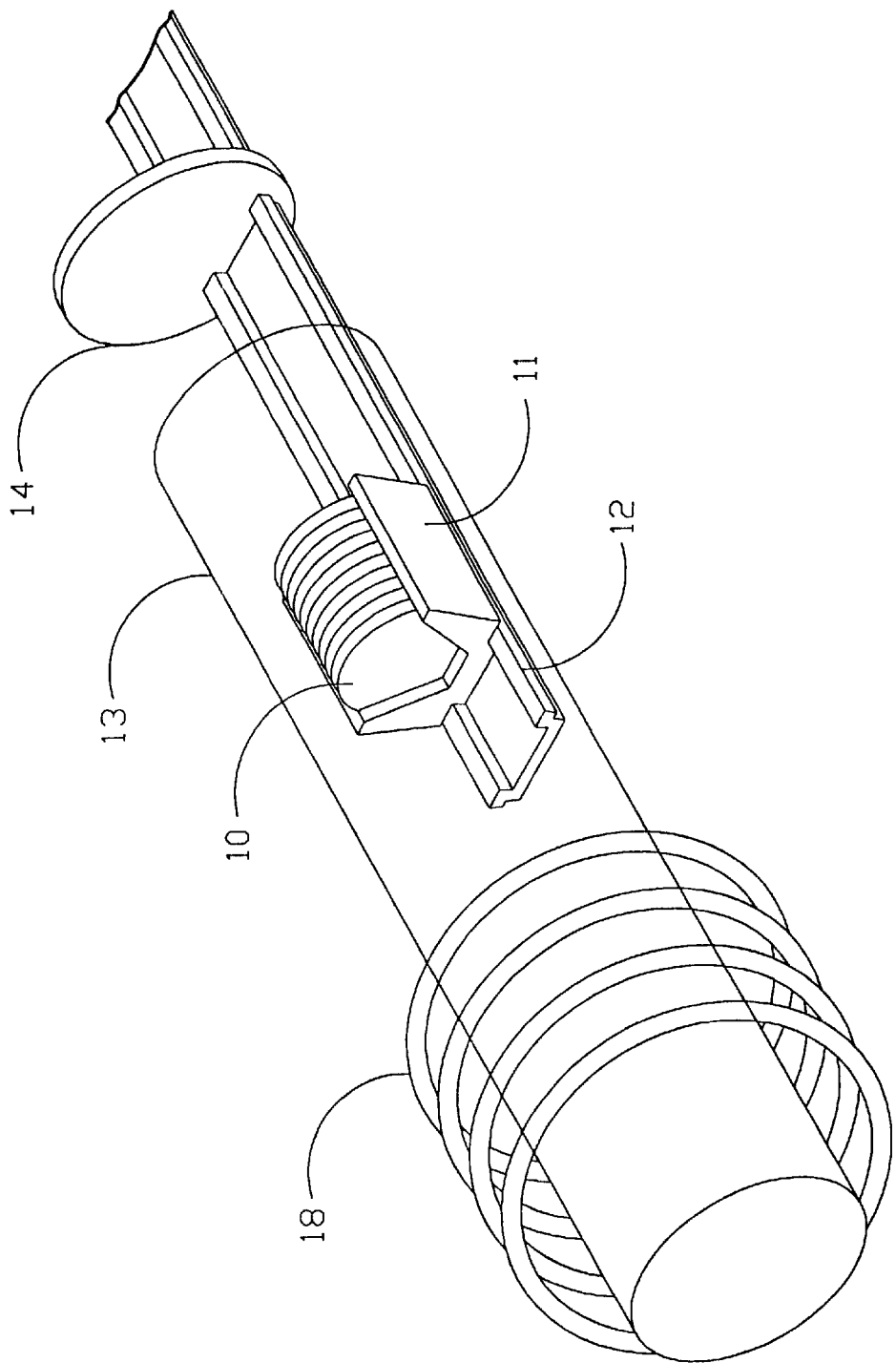
FIG. 1A shows a structure diagram of the horizontal type furnace.
Figure 1B:
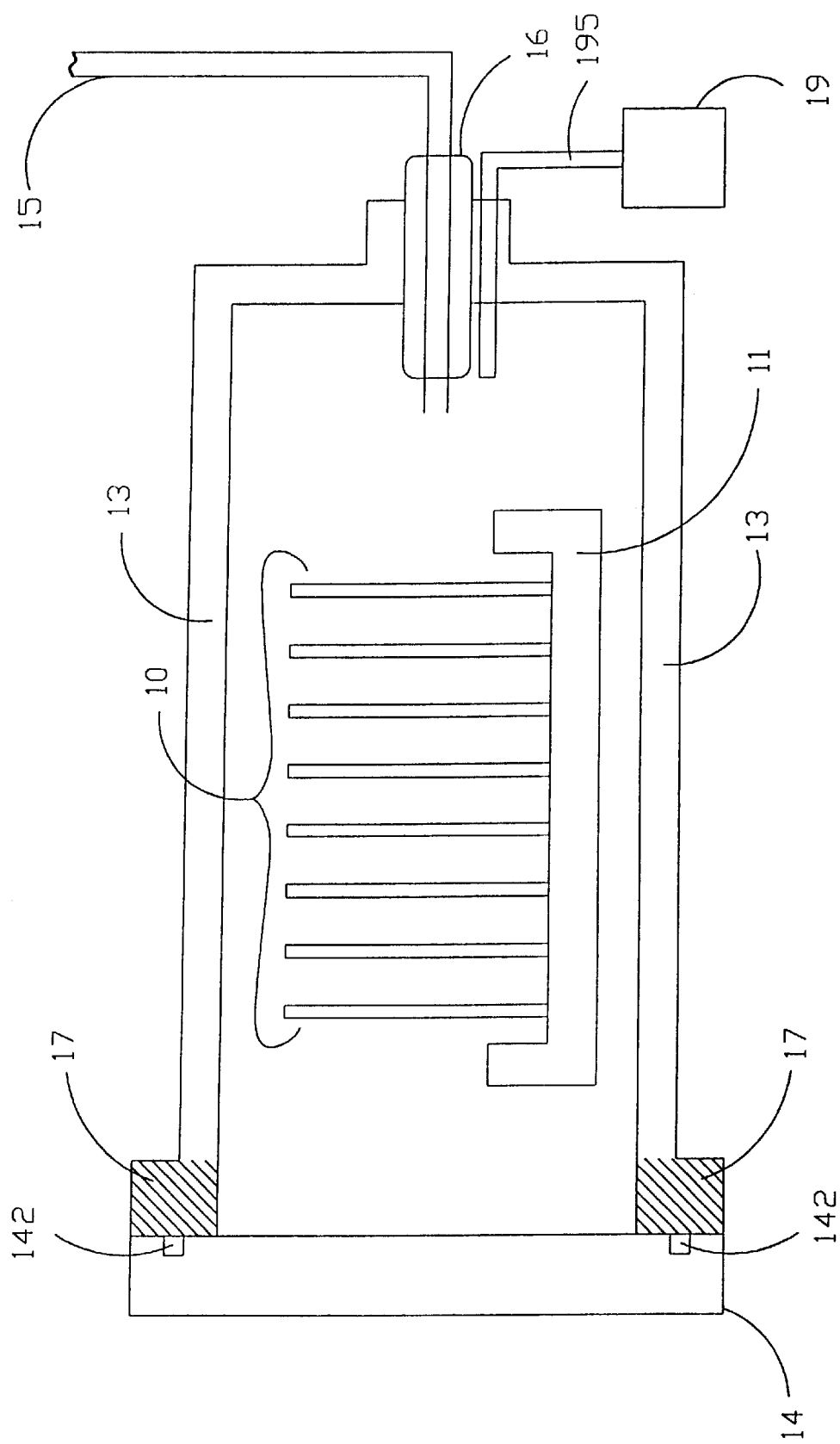
FIG. 1B shows a cross-section diagram of the furnace.
Figure 1C:
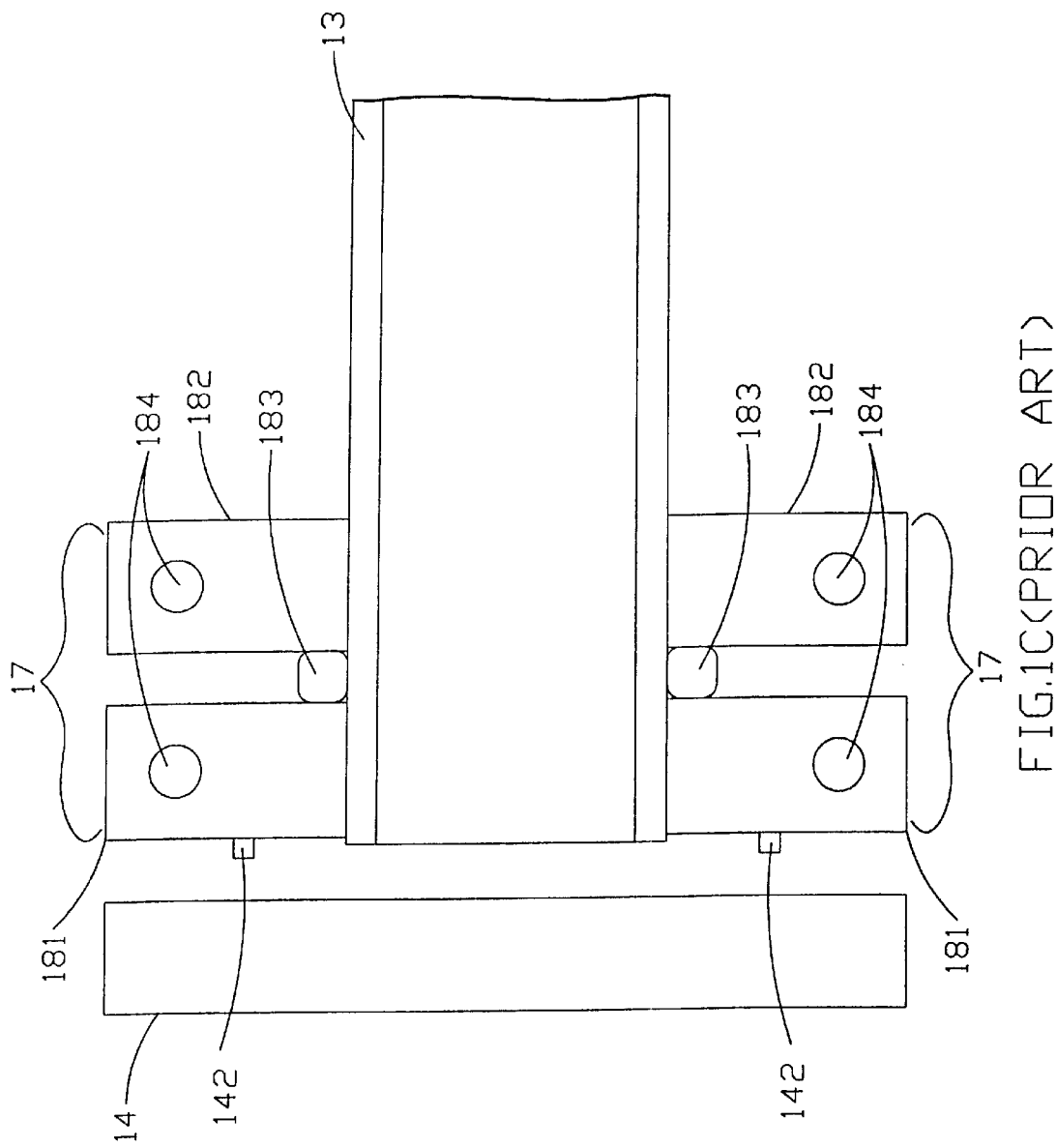
FIG. 1C shows part of a cross-section diagram which comprises the process tube, the flange, the door, and the cooling system on the furnace.

The foregoing aspects and many of the attendant advantages of this invention will become more readily appreciated as the same becomes better understood by reference to the following detailed description, when taken in conjunction with the accompanying drawings, wherein:

In the traditional furnace process, the by-products which are formed by reaction vapor become solid phase particles when the environment temperature is lower than the critical temperature which divides by-products into vapor phase and solid phase. These solid phase by-products usually bring a lot of problems in the process. In the traditional furnace equipment, we usually assemble a single cycle cooling system in the flange to protect the end O-ring and the flange O-ring. The function of the end O-ring and the flange O-ring is to keep a airtight space in the process tube. We usually use water to be the cooling liquid in the cooling system. The water flow into the second flange and flow out of the first flange to decrease the temperature of the place around the flange and to prevent the end O-ring and the flange O-ring to be damaged in over high temperature to increase the cost of the production. But the boiling point of the water is 100° C., we just keep the temperature of the place around the flange about 100° C. and raise the temperature hardly. This temperature is almost lower than the critical temperature which divides by-products into vapor phase and solid phase. Therefore, the solid phase by-products are easier formed at the place around the flange and affect the wafers which are in the proceeding process.

Generally speaking, if we use a single cycle cooling system in discontinuously providing the circular cooling water or controlling the flow rate in the circular cooling water, we can solve the problems from solid phase by-products. When we provide the circular cooling water or we provide bigger amount of the flow rate in the circular cooling water, the temperature at the place around the flange is lower than the critical temperature which divides by-products into vapor phase and solid phase and easily form solid phase by-product particles. When we stop to provide the circular cooling water or we provide smaller amount of the flow rate in the circular cooling water, the temperature at the place around the flange is raised suddenly and is higher than the critical temperature which divides by-products into vapor phase and solid phase. This condition makes the solid phase by-product particles, which are formed when the circular cooling water is provided or the amount of circular cooling water is bigger, to become the vapor phase by-product following the elevation of the temperature and not to affect the wafers which is in the preceding process. However, the interrupted time in the circular cooling water and the amount of the flow rate in the circular cooling water are not easily controlled with exactness. The breakdown probability in the pump which is used for providing the discontinuous circular cooling water is also higher. Then we can find the end O-ring and the flange O-ring are usually damaged when the pump is broken down. This condition will increase the cost of production.

The lifetime of the O-ring is in inverse proportion to the temperature of the environment. When the temperature of the environment in using the O-ring is higher and higher, the lifetime of the O-ring is shorter and shorter. On the other hand, when the temperature of the environment in using the O-ring is lower and lower, the lifetime of the O-ring is longer and longer. But in the furnace process, when the environment temperature of the flange is lower and lower, the solid phase by-products are more easily deposited at the place near the flange in the process tube. When the environmental temperature of the flange is higher and higher, the probability of depositing the solid phase by-products at the place near the flange is lower. However, this condition will decrease the lifetime of the O-ring. The present invention provides a multi-cycle cooling system to decrease the probability of depositing the solid phase by-product particles at the place near the flange and to extend the lifetime of the O-ring as far as possible in the high temperature environment for short time by using different cooling systems in different ways in the process. The present invention also can increase the probability of the preceding process.

The using life of the O-ring is in inverse proportion to the temperature of the environment. When the temperature of the environment is higher and higher, the useful life of the O-ring is shorter and shorter. When the temperature of the using environment is lower and lower, the usful life of the O-ring is longer and longer. But in the furnace process, when the temperature of the O-ring environment is lower and lower, the solid by-products will be more and more easily deposited in the chamber. When the temperature of the O-ring environment is higher and higher, the solid by-products will not be deposited. However, the useful life of the O-ring will be reduced. The present invention uses the multi-cycle cooling system to use different cooling systems in the different preceding ways in the process. This condition will make the O-ring in the high temperature environment at the short time to decrease the probability in depositing the by-products which are near the O-ring and to extend the useful life of the O-ring as far as possible. This condition can further increase the efficiency of the process.

Figure 2A:
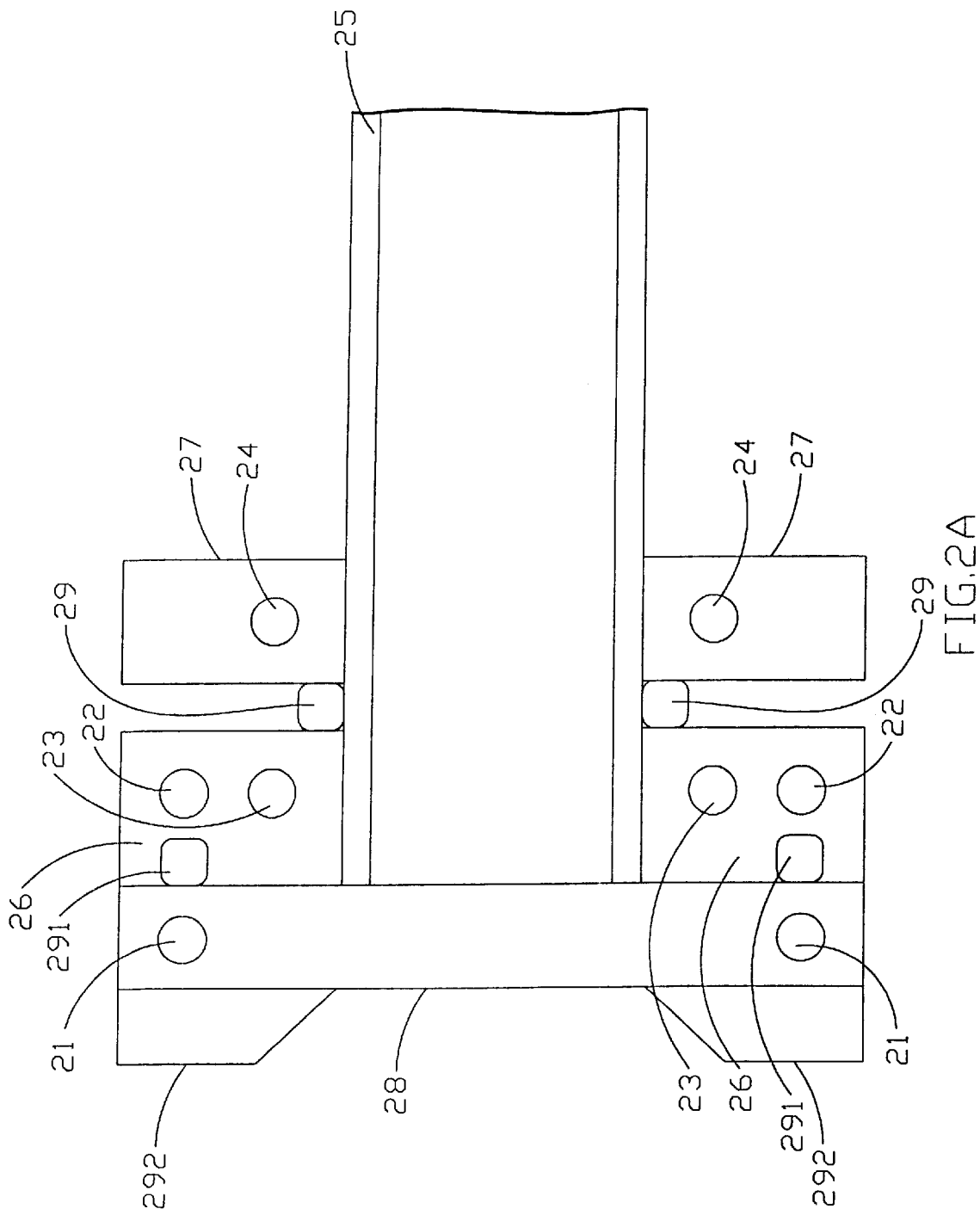
FIG. 2A shows a cross-section diagram which comprises the process tube, the flange, the door, and the cooling system to be composed in the present invention.

FIG. 2A shows a cross-section diagram which comprises the process tube, the flange, the door, and the cooling system to be composed in the present invention. This embodiment of the present invention is a cooling system used for cooling the place near the door terminal on the process tube. The present invention in this embodiment comprises: a door 28, a process tube 25, heat sinks 292, the first flange 26, the second flange 27, and a flange O-ring 29. The first flange 26 and the second flange 27 are at the place near the door 28 terminal on the process tube 25. The heat sinks 292 are on the door 28 to increase the thermal dissipating probability of the door 28. The flange O-ring 29 is at the place between the first flange and the second flange to seal the vacant space which is between the first flange and the second flange. The door 28 comprises the first gas cooling cycle 21. The first flange comprises the second gas cooling cycle 22 and the first liquid cooling cycle 23. The second flange comprises the second liquid cooling cycle 24.

FIG. 2B shows a cross-section diagram which comprises the process tube, the flange, the door, and the cooling system to be composed in another form of the present invention. In order to decrease the probability of inside the process tube 25 being polluted with outside environment like reactant leakage or outside impurities entering to inside the process tube 25, we can assemble an end O-ring 291 at the place on the side of the first flange 26 near the door 28 to seal the vacant space when the door 28 and the first flange 26 are combined in hermetically. In order to extend the lifetime of the end O-ring, we can define a heat insulation slot 293 on the door 28 near the side of the end O-ring 291 to decrease the thermal energy being conducted from the door 28 to the end O-ring 291.

It is clear that the difference between this embodiment of the present invention and the traditional technology is using the gas cooling cycle and the liquid cooling cycle at the same time in the present invention. The traditional technology only uses a liquid cooling cycle, which is limited in the boiling point of the liquid, not to raise the temperature at will. The gas which is used in the gas cooling cycle does not have this limit.

The first gas cooling cycle 21 is located in the door 28 and is opened when inside the process tube is proceeding the high temperature process like the depositing process. In other words, the first gas cooling cycle just proceeds in cooling function when inside the process tube is proceeding the high temperature process. Furthermore, the gas flowing in the first gas cooling cycle is like the high pressure air or the dry and cold air. The high temperature process generally means that the reaction temperature in the semiconductor process is higher than 800° C. The reactant that is used for forming the silicon nitride in the high temperature process comprise $NH_3$ and $SiCl_2H_2$.

The second gas cooling cycle 22 and the first liquid cooling cycle 23 are located in the first flange 26. The second gas cooling cycle 22 is just opened when inside the process tube is proceeding the high temperature process. The first liquid cooling cycle 23 is just closed when inside the process tube 25 is proceeding the high temperature process. In other words, the first liquid cooling cycle 23 is used for cooling the flange in the low temperature process and the second gas cooling cycle 22 is used for cooling the flange in the low temperature process. The gas flowing in the second gas cooling cycle 22 is like the high pressure cold gas, the nitrogen, or the inert gas. The liquid flowing in the first liquid cooling cycle 23 is the refrigerant or the water. We usually use the water to be the cooling liquid in the first liquid cooling cycle 23. Furthermore, the second gas cooling cycle 22 and the first gas cooling cycle 21 can use the same gas source or different gas sources.

The second liquid cooling cycle 24 is in the second flange 27. The second liquid cooling cycle 24 and the first liquid cooling cycle 23 are the independent systems to each other. The liquid sources in the second liquid cooling cycle 24 and the first liquid cooling cycle 23 are different. The second liquid cooling cycle 24 is always opened whether or not the inside the process tube 25 proceeds with the high temperature process. The liquid flowing in the second liquid cooling cycle 24 is the refrigerant or the water. We usually use the water as the cooling liquid in the second liquid cooling cycle 24.

Before we further explain the functions of the present invention, we have to emphasize that the wafers must be tested, adjusted, and prepared after the wafers to be placed in the process tube in the real furnace process at first. These steps are like judging the locations of the wafers to be right or not, cleaning the wafers, or extracting a vacuum situation in the process tube. After these steps, we just proceed with the different semiconductor processes like transporting reactions, heating, and depositing. After these processes, we must drop the temperature inside the process tube and break the vacuum inside the process tube. Finally, we just take out the wafers from the process tube. The process tube only must be heated at the high temperature when inside the process is proceeding with vapor depositing high temperature process. The process tube does not have to be heated at the high temperature in others processes. In other words, the elements on the process tube just need to be protected by the cooling system when the process tube is proceeding with the high temperature process. These elements are like the end O-ring or the flange O-ring.

The basic rules in this embodiment can be found from FIG. 2C. Before the process tube proceeds the high temperature process, we only open the first liquid cooling cycle 23 and the second cooling cycle 24 to proceed the cooling function. When inside the process tube 25 is proceeding the high temperature process, only the first liquid cooling cycle 23 is not opened to proceed the cooling function. After inside the process tube 25 proceeds the high temperature process, we still open the first liquid cooling cycle 23 and the second cooling cycle 24.

The furnace is a device which need to be heated at the high temperature, but the heating rate of the furnace is slow. Therefore, when the furnace not proceeds the high temperature process, the furnace must be kept at the certain temperature to increase the efficiency of the proceeding process. When inside the process tube not proceeds the high temperature, the temperature inside the process tube is about 400° C. If we do not assemble the cooling system to protect the end O-ring 291 and the flange O-ring 29, which keep inside the process tube to be a airtight space, the lifetime of the end O-ring 291 and the flange O-ring 29 will be decreased in this temperature environment. Therefore in the present invention, when inside the process tube not proceeds the high temperature, the first liquid cooling cycle 23 and the second liquid cooling cycle 24 are opened to decrease the temperature of the end O-ring 291 and the flange O-ring 29. When inside the process tube not proceeds the high temperature, there is not any reaction gas in the process tube. Therefore, when we use liquid to proceed cooling function, we do not have the problems about producing solid phase by-products.

When we place the wafers in the process tube and import the reaction gas to inside the process tube to proceed the high temperature process, the first liquid cooling cycle 23 is closed instantly and the first gas cooling cycle 21 and the second gas cooling cycle 22 are opened at once. When inside the process tube proceeds the high temperature process, the higher temperature place in the process tube is the place which is placed the wafers. The temperature is decreased following the increased length between the place and the wafers. The length between the first liquid cooling cycle 23 and the high temperature place is longer than the length between the second liquid cooling cycle 24 and the high temperature place. Therefore, the temperature at the place near the first liquid cooling cycle 23 is lower. When inside the process tube is proceeding the high temperature process, the reaction gas in the process tube will proceed the chemical reaction process and will form the by-products. The by-products are following the decreasing environment temperature to increase the probability of forming the solid phase by-products particles. Therefore, the first liquid cooling cycle 23 must be closed to prevent forming the solid phase by-products particles, which can affect the wafers in the proceeding process, at the place near the first liquid cooling cycle 23. If we do not use cooling system, the end O-ring 291 and the flange O-ring 29, which are used for making the process tube to be a airtight space, will be damaged at the over high temperature. Therefore, the first gas cooling cycle 21 and the second gas cooling cycle 22 are must opened at once to decrease the temperature of the end O-ring 291 and the flange O-ring 29. The condition that the first gas cooling cycle 21 and the second gas cooling cycle 22 are opened not only protects the end O-ring 291 and the flange O-ring 29, but also increase the temperature at the place near the door 28 in the process tube 25 to the standard that the solid phase particles are not easily formed by the gas cooling cycle. We will not have the problems in raising the temperature hardly like using liquid cooling cycle and being limited in the boiling point of the liquid. The cooling efficiency in using the gas cooling cycle is lower than using the liquid cooling cycle. But using the gas cooling cycle can make the by-products that are formed from the reaction gas in the process tube to keep the vapor phase state. This condition can not produce solid phase by-products particles in the over low temperature process to affect the qualities of the wafers in the proceeding process.

Furthermore, the heat insulation slot 293, which can decrease the heat conduction area, is on the door 28 to decrease the heat conducting from the center to the side of the door near the end O-ring and to extend the lifetime of the end O-ring 291. We also assemble several pieces of the heat sinks 292 on the door 28 to increase the heat conduction efficiency of the door. These heat sinks can avoid the temperature of the door too high to conduct the heat to the end O-ring and can extend the lifetime of the end O-ring 291.

Generally speaking, the lifetime of the end O-ring 291 and the flange O-ring 29, which are used for making a airtight space in the process tube 25, are immovable. The end O-ring 291 and the flange O-ring 29 are damaged easily in the high temperature environment for a long time. Therefore, when inside the process tube not proceeds the high temperature process, we use the first liquid cooling cycle 23 and the second liquid cooling cycle 24. When inside the process tube 25 is proceeding with the high temperature process, we use the first gas cooling cycle 23, the second gas cooling cycle 24, and the second liquid cooling cycle 22. The objective of this way is to prevent that the end O-ring 291 and the flange O-ring 29 from being in the high temperature environment for a long time to decrease the lifetime. This way also can prevent the solid phase by-products particles from being formed.

In order to increase the cooling efficiency of the door 28, we can add the third liquid cooling cycle (not shown in the diagram) in the door 28 and cooperate with the second gas cooling cycle 22 in the preceding process. The third liquid cooling cycle can increase the cooling efficiency of the door 28 and can extend the lifetime of the end O-ring 291. Furthermore, the third liquid cooling cycle can also avoid the solid by-products from being formed. When inside the process tube 25 is proceeding with the high temperature process, the third liquid cooling cycle is closed and the second gas cooling cycle 22 is opened to proceed with the cooling process. When inside the process tube 25 not proceeds the high temperature process, the second gas cooling cycle 22 is closed and the third liquid cooling cycle is opened to proceed the cooling process. The third liquid cooling cycle, the second liquid cooling cycle, and the first liquid cooling cycle are independent systems with respect to each other. The liquids flowing in the third liquid cooling cycle, the second liquid cooling cycle, and the first liquid cooling cycle are the refrigerant or the water.

Figure 3A:
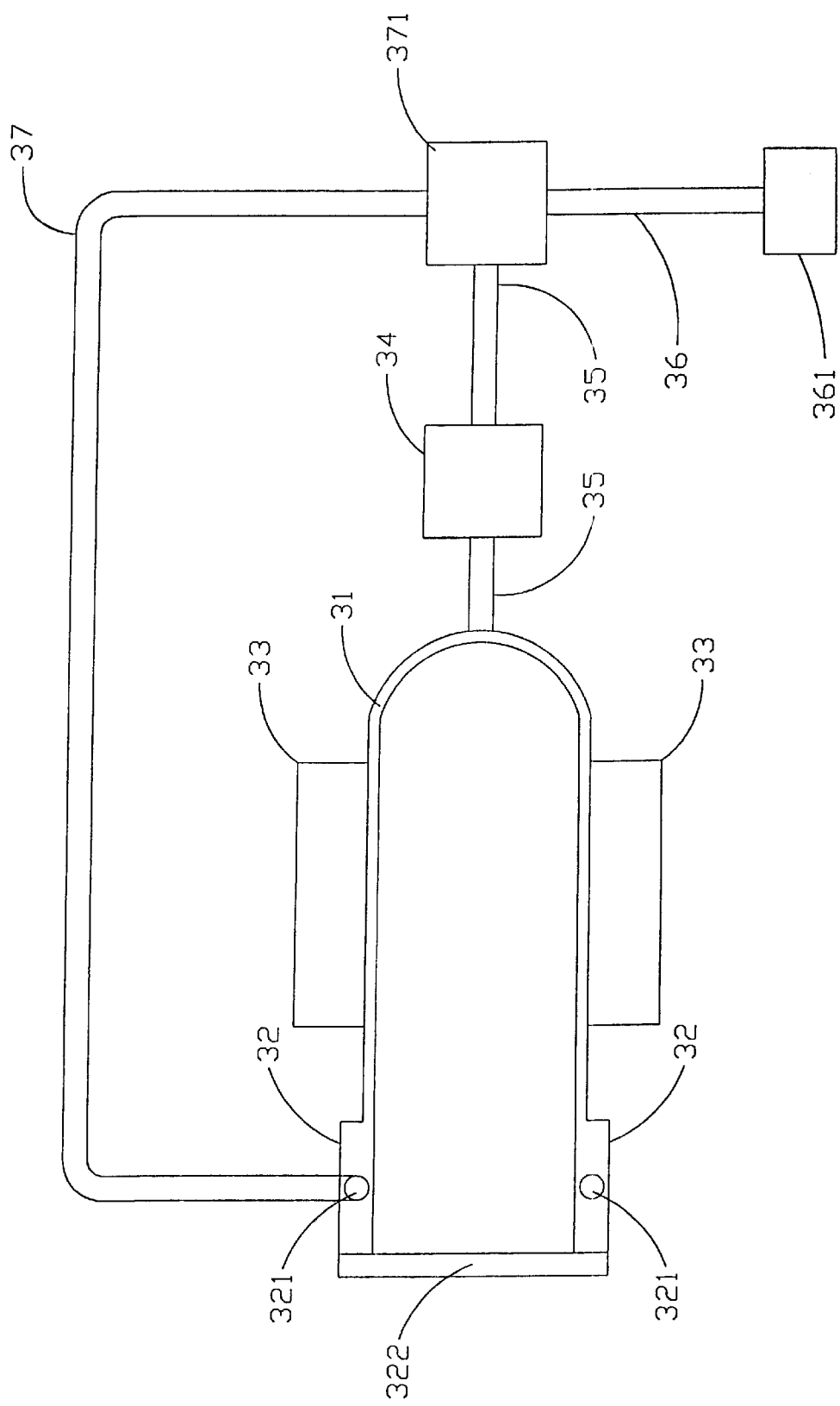
FIGS. 3A to 3C shows the structural diagram in another embodiment of the present invention.

FIG. 3A shows the structural diagram in another furnace system of the present invention. The furnace system comprises: a process tube 31, a flange 32, a heater 33, a pump 34, the first tube 35, the second tube 36, and the third tube 37.

The process tube 31 is used for proceeding a semiconductor process. The reaction gas is usually formed the solid phase particles in the lower temperature environment in the semiconductor process to affect the qualities of the wafers which is proceeding the process. The flange 32 is on the process tube 31 near the door terminal and inside the flange comprises a gas cooling cycle 321. The gas cooling cycle 321 also can be assembled in the flange 32 and the door 322 at the same time. The cooling system, which is used for cooling the flange 32, comprises a gas cooling cycle 321 and a liquid cooling cycle. The cooling system is similar to the cooling system which is described in the above embodiment. Furthermore, the heater 33 is on the outside around the process tube 31 to provide the heat to the process tube 31 which proceeds the semiconductor process. The pump 34 is used for extracting the remainder reaction gas and the by-products from the process tube 31 after the semiconductor process. The first tube 35 is used for connecting the process tube 31 and the pump 34. The second tube 36 is used for connecting the pump 34 and the means for treatment 361. The means for treatment is used for treating the reaction gas, cooling gas, and the by-products. The third tube 37 is used for transmitting the gas, which is discharged from the gas cooling cycle 321, to the second tube 36 passing through the venturi 371. Then the gas enter to the means for treatment to be treated.

After comparing the embodiment and the traditional furnace, we can find two outstanding characteristics. The first, we always use the gas cooling circle 321 in the cooling system in the flange and we only use the liquid cooling cycle in the flange in the traditional technology. Therefore, the embodiment can avoid the temperature at the place near the flange to be limited in the boiling point of the liquid, which is used in the liquid cooling cycle, lower than the critical temperature, which divides by-products into the vapor phase and the solid phase, and decrease the defects in forming solid phase by-products particles. The embodiment furthermore can decrease the probability of forming the solid phase particles at the place near the flange effectively. The second, the embodiment make the gas, which is discharged from the gas cooling cycle 321, transmitting to the second tube 36 passing through the third tube 37 and the venturi 371. The gas can obviously raise the efficiency of the pump and dilute the waste gas which is discharged by the pump 34. The gas furthermore can raise the temperature of the waste gas. In other words, we can decrease the probability of making the by-products to be transformed the solid phase particles in the furnace.

Figure 3B:
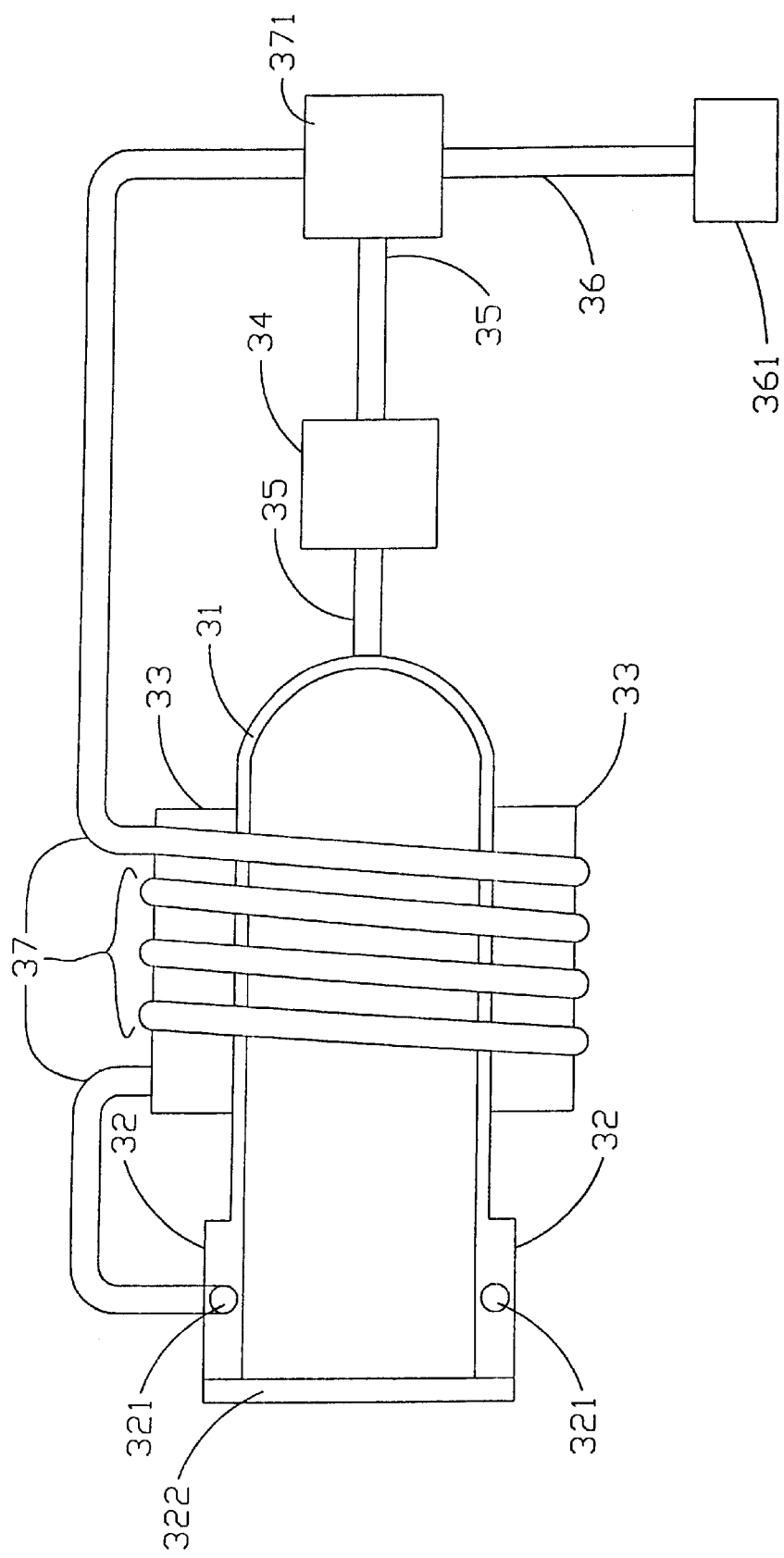
Figure 3C:
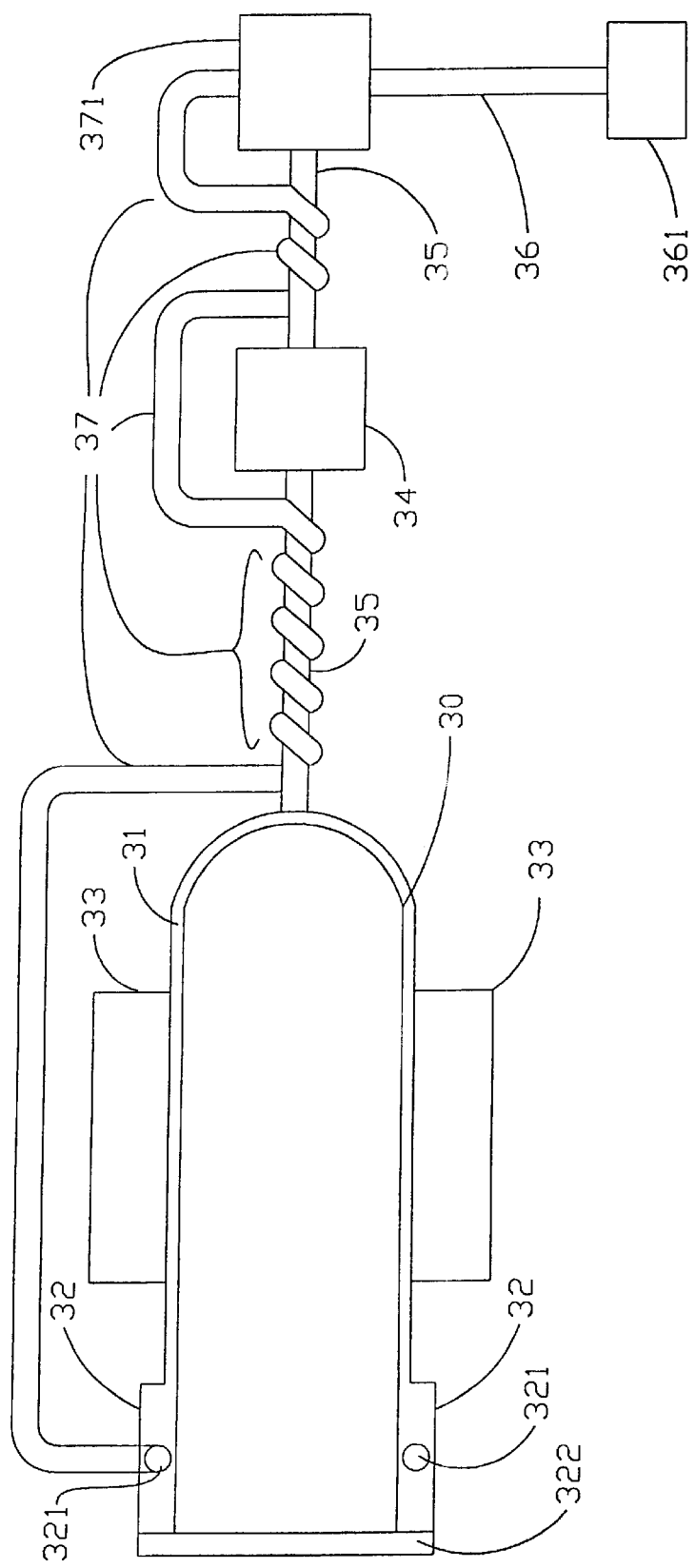

Referring to FIG. 3B, in order to decrease the probability of making by-products to transform the solid phase particles in the first tube and forming the solid phase particles due to the temperature to be lower, the embodiment can raise the temperature of the gas in the third tube 37 by using the third tube 37 surrounding to the heater 33 and then connecting to the venturi 371. Referring to FIG. 3C, the embodiment also can raise the temperature of the gas in the first tube 35 by using the third tube 37 surrounding to the first tube 35 and then connecting to the venturi 371. The embodiment can also contain the two kinds of improved methods.

In the traditional technologies, the methods for preventing the solid phase particles to be formed in the first tube 35 and the second tube 36 is to shorten the length of each tube, to decrease the possibility of the curves appearing on the tubes by changing the shape of each tube, or to assemble the particles trap devices in each tube. But there are too many conditions in disposing the furnace system to prevent the particles to be formed by adjusting the length and the shape of the tubes in general. Furthermore, the structure of the heat trap devices or the cold trap device is complex and the furnace system is disposed in complex in using the particle trap device. In accordance with the above description, the methods for preventing the solid phase particles to be formed in the first tube 35 and the second tube 36 is always following the defects which can not be ignored. Relatively, these two improved ways in the embodiment do not need to change the configuration of each tube and to assemble the particles trap device. We just only surround the tubes by using the heat gas. The embodiment is a easier method obviously especially adding the gas cooling cycle in the furnace system.

Furthermore, the embodiment also can use the liquid cooling cycle when the temperature is lower in the process. We just open the gas cooling cycle 321 and close the liquid cooling cycle when the temperature is higher in the process like the process tube 31 proceeding the high temperature process. In other words, referring to the first embodiment, the flange 32 comprises the first liquid cooling cycle (not showing in the diagram). The length between the place of the first liquid cooling cycle and the center of the process tube 31 is shorter than the length between the place of the gas cooling cycle 321 and the center of the process tube 31. The flange 32 comprises the second liquid cooling cycle (not showing in the diagram). The length between the place of the second liquid cooling cycle and the center of the process tube 31 is longer than the length between the place of the first liquid cooling cycle and the center of the process tube 31. At this time, the first liquid cooling cycle is always opened, and the second liquid cooling cycle is opened until the temperature inside the process tube 31 to be higher than the critical temperature. The gas cooling cycle 321 is still closed until the temperature inside the process tube 31 to be higher than the critical temperature. The critical temperature means that when the temperature inside the process tube 31 is lower than the critical temperature, the by-product which is formed by using the reaction gas in the semiconductor process deposits in the process tube 31 to become the solid phase particles. For example, when we make $NH_3$ reacting with $SiCl_2H_2$ to deposit the silicon nitride by using the low pressure vapor chemical deposition (LPVCD) method in the semiconductor process, the critical temperature is about 150° C. If the temperature at the place near the cooling system is lower than the critical temperature, the solid phase particles will be formed at the place near the cooling system to affect the qualities of the wafers which are proceeding the process.

When we use the traditional cooling system, the end O-ring and the flange O-ring must be changed after about two processes to ensure that the inside of the process tube is an airtight space. After the furnace process we must clean the door to clean the particles and ensure inside the process tube to be a clean space to raise the qualities of the products. If we use the present invention in the multi-cycle cooling system, the end O-ring and the flange O-ring just must be changed after about six times to ensure that the inside of the process tube is an a airtight space. After the furnace process, we do not need to clean the door to clean the particles. This shows that the multi-cycle cooling system can raise the efficiency of the proceeding process, decrease the bad rate of the products, and decrease the cost of the production.

In accordance with the present invention, the present invention provides a multi-cycle cooling system in the flange and the door. When inside the process tube not proceeds the high temperature process, we use the first liquid cooling cycle and the second liquid cooling cycle to decrease the temperature at the place near the end O-ring and the flange O-ring. When inside the process tube proceeds the high temperature process and the reaction gas is transmitted to inside the process tube, we use the first gas cooling cycle, the second gas cooling cycle, and the second liquid cooling cycle to decrease the temperature at the place near the end O-ring and the flange O-ring. The present invention can ensure the well functions in the end O-ring and the flange O-ring to make inside the process tube to be a airtight space and not to be damaged in the over high temperature environment. The present invention can also decrease the probability of forming the solid phase by-products at the place near the end O-ring and the flange O-ring because of the over low temperature. The condition can avoid the solid phase by-products particles to deposit on the surface of the wafers, which are proceeding the process, to increase the qualities of the wafers. The multi-cycle cooling system can also increase the cycle time of the process, decrease the times in cleaning the furnace, raise the efficiency of the proceeding process, and decrease the cost of the production.

Although specific embodiments have been illustrated and described, it will be obvious to those skilled in the art that various modifications may be made without departing from what is intended to be limited solely by the appended claims.

What is claimed is:

1. A furnace system, comprises:
   a process tube, said process tube to be used for proceeding a semiconductor process, a by-product generally to become the solid phase particles at a temperature in said process tube less than a predetermined value in said semiconductor process;
   a flange located on said process tube near a door terminal and comprising a gas cooling cycle which is opened when a temperature in said process tube is greater than solid predetermined value, wherein said predetermined value means that when said temperature in said process tube is less than said predetermined value, said by-product deposits and becomes said solid phase particles;
   a heater located around said process tube and providing a required heat of said semiconductor process;
   a pump pumping both remainder a reactants and a plurality of by-products of said semiconductor fabricating process away inside said process tube;
   a first tube connecting said process tube and said pump;
   a second tube connecting said pump and means for treatment, wherein said means for treatment to be used for treating said reactants and said by-products; and
   a third tube used for transmitting the gas which is exhausted from said gas cooling cycle to said second tube passing through a venture.

2. The furnace system according to claim 1, wherein said gas cooling cycle can be located in the flange and in the door at the same time.

3. The furnace system according to claim 1, further comprising twine said third tube around said heater before connects with said venturi.

4. The furnace system according to claim 1, further comprising twine said third tube around said first tube before connects with said venturi.

5. The furnace system according to claim 1, wherein a cooling system, which is used for cooling said flange, comprises said gas cooling cycle and a liquid cooling cycle at the same time.

6. The furnace system according to claim 5, wherein said cooling system further comprising a first liquid cooling cycle that is closer to the center of inside said process tube than said gas cooling cycle.

7. The furnace system according to claim 6, wherein said first liquid cooling cycling is always opened without the relationship between said temperature in said process tube and said critical temperature.

8. The furnace system according to claim 5, wherein said cooling system further comprises a second liquid cooling cycle that is more far away center of inside said process tube than said first liquid cooling cycle.

9. The furnace system according to claim 8, wherein said second liquid cooling cycle is closed when said temperature of said reactants is greater than said predetermined value, otherwise said second liquid cooling cycle is always opened.

10. The furnace system according to claim 1, wherein said predetermined value is about 150° C. when said semiconductor process is a low pressure chemical vapor deposition for forming silicon nitride.

11. A cooling method for reducing the amount of a solid phase by-products in a process tube and preventing a end O-ring and a flange O-ring to be damaged, said cooling method comprises:

opening a first liquid cooling cycle which is in a first flange of said process tube to decrease a temperature of said end O-ring and said flange O-ring;

opening a second liquid cooling cycle which is in a second flange of said process tube to decrease said temperature of said end O-ring and said flange O-ring;

placing a wafer in said process tube;

combining a door and said process tube to make inside said process tube to become a airtight space;

heating said process tube to increase a temperature in said process tube;

transmitting a first reaction gas and a second reaction gas when said temperature in said process tube greater than a predetermined value;

opening a first gas cooling cycle and a second gas cooling cycle and closing said first liquid cooling cycle at the same time to prevent said solid phase by-product to be produced when said temperature is less than said predetermined value and to prevent said end O-ring and said flange O-ring to be damaged when said temperature is greater than said predetermined value;

stopping to heat said process tube and stopping to transmit said first reaction gas and said second reaction gas;

using a pump to extract a remainder reaction gas and a vapor by-product which are produced in said high temperature process from inside said process tube;

dividing said door and said process tube and taking out said wafer from inside said process tube; and closing said first gas cooling cycle and said second cooling cycle and opening said first liquid cooling cycle at the same time to increase the cooling velocity of said end O-ring and said flange O-ring.

12. The cooling method according to claim 11, wherein said end O-ring is located on a side of said first flange, wherein said side facing to said door.

13. The cooling method according to claim 11, wherein said door further comprises a plurality of heat sinks, said heat sinks being used to radiate heat for protecting said end O-ring.

14. The cooling method according to claim 11, wherein said door further comprises a heat insulated slot for increasing lifetime of said end O-ring by reducing amount of heat that conducts to said end O-ring.

15. The cooling method according to claim 11, wherein the gas flowing in said first gas cooling cycle is a high pressure air.

16. The cooling method according to claim 11, wherein the gas flowing in said first gas cooling cycle is a cool dry air.

17. The cooling method according to claim 11, wherein the gas flowing in said second gas cooling cycle is a high pressure air.

18. The cooling method according to claim 11, wherein the gas flowing in said second gas cooling cycle is nitrogen.

19. The cooling method according to claim 11, wherein the gas flowing in said second gas cooling cycle is a insert gas.

20. The cooling method according to claim 11, wherein the liquid flowing in said first liquid cooling cycle is freon.

21. The cooling method according to claim 11, wherein the liquid flowing in said first liquid cooling cycle is water.

22. The cooling method according to claim 11, wherein the liquid flowing in said second liquid cooling cycle is freon.

23. The cooling method according to claim 11, wherein the liquid flowing in said second liquid cooling cycle is water.

24. The cooling method according to claim 11, wherein said predetermined value is about 800° C.

* * * * *